(12) United States Patent
Billaut

(10) Patent No.: US 11,588,323 B2
(45) Date of Patent: Feb. 21, 2023

(54) METHOD AND APPARATUS FOR LOCATING FAULTS IN AN ISLANDED MICROGRID

(71) Applicant: Commonwealth Associates, Inc., Jackson, MI (US)

(72) Inventor: Sebastien C. Billaut, Lake Mary, FL (US)

(73) Assignee: Commonwealth Associates, Inc., Jackson, MI (US)

( * ) Notice: Subject to any disclaimer, the term of this patent is extended or adjusted under 35 U.S.C. 154(b) by 251 days.

(21) Appl. No.: 17/011,538

(22) Filed: Sep. 3, 2020

(65) Prior Publication Data
US 2022/0069567 A1    Mar. 3, 2022

(51) Int. Cl.
  *H02H 7/22*    (2006.01)
  *G01R 31/08*   (2020.01)
  *G01R 19/00*   (2006.01)
  *H02H 1/00*    (2006.01)

(52) U.S. Cl.
  CPC ........... *H02H 7/22* (2013.01); *G01R 19/0084* (2013.01); *G01R 31/086* (2013.01); *H02H 1/0007* (2013.01)

(58) Field of Classification Search
  CPC .............. G01R 19/0084; G01R 31/086; H02H 1/0007; H02H 3/027; H02H 7/22; H02H 7/30; H02J 3/00; H04J 3/0635
  See application file for complete search history.

(56) References Cited

U.S. PATENT DOCUMENTS

| 3,593,124 A | * | 7/1971 | Cahen ................... G01R 31/08 324/520 |
| 6,615,916 B1 | | 9/2003 | Vachon |
| 8,532,230 B2 | | 9/2013 | Taft |
| 9,007,735 B2 | | 4/2015 | Park |
| 9,310,416 B2 | | 4/2016 | Al-Ghannam et al. |

(Continued)

FOREIGN PATENT DOCUMENTS

| CN | 106257784 B | 12/2016 |
| CN | 106990320 A | 7/2017 |

(Continued)

OTHER PUBLICATIONS

Patent Cooperation Treaty, International Search Report and Opinion, dated Dec. 20, 2021, (10 pages).

*Primary Examiner* — Jared Fureman
*Assistant Examiner* — Nicolas Bellido
(74) *Attorney, Agent, or Firm* — Gunther Evanina; Butzel Long

(57) ABSTRACT

A fault isolating device for use in a microgrid disconnected from a main power grid includes a voltage meter for detecting a voltage anomaly indicative of an electrical fault, a timer for establishing a time window that begins and ends a predetermined time after a voltage anomaly is detected, a switch that is opened at the start of the time window, and a microcontroller that determines whether to leave the switch open to isolate a faulted portion of the microgrid or to close the switch. A plurality of fault isolating devices can be distributed throughout a microgrid to isolate a faulted branch or faulted branches of an islanded microgrid without interfering with normal fuse operation when the microgrid is connected to the main power grid.

18 Claims, 2 Drawing Sheets

(56) References Cited

U.S. PATENT DOCUMENTS

| | | |
|---|---|---|
| 9,823,637 B2 | 11/2017 | Rostron et al. |
| 9,894,080 B1* | 2/2018 | Youssef .............. H04L 67/1095 |
| 10,324,459 B2 | 6/2019 | Lv et al. |
| 10,483,754 B2 | 11/2019 | Hong et al. |
| 2008/0310062 A1 | 12/2008 | Kumfer |
| 2017/0234921 A1 | 8/2017 | Handy |
| 2018/0323611 A1* | 11/2018 | Gubba Ravikumar ...................... G05B 17/02 |
| 2019/0245343 A1 | 8/2019 | Porter et al. |
| 2019/0319481 A1* | 10/2019 | Jin ........................... H02H 7/26 |
| 2019/0334344 A1* | 10/2019 | Aubert .............. H02J 13/00002 |
| 2020/0011903 A1 | 1/2020 | Menzel et al. |
| 2020/0011908 A1 | 1/2020 | Bickel |
| 2020/0013277 A1 | 1/2020 | Bickel |
| 2020/0041561 A1 | 2/2020 | Alibert et al. |
| 2022/0146594 A1* | 5/2022 | Schierling ............ G01R 31/086 |

FOREIGN PATENT DOCUMENTS

| | | |
|---|---|---|
| CN | 105527539 A | 5/2018 |
| CN | 108519542 A | 9/2018 |
| CN | 106291258 B | 12/2018 |
| CN | 107437794 A | 12/2019 |
| CN | 109066610 A | 1/2020 |
| JP | 2019-096402 A | 6/2019 |
| WO | WO 2008/146358 | 12/2008 |
| WO | WO 2017/202165 A1 | 11/2017 |

* cited by examiner

METHOD AND APPARATUS FOR LOCATING FAULTS IN AN ISLANDED MICROGRID

FIELD OF THE DISCLOSURE

Described herein are devices and methods for locating and isolating electrical faults in a microgrid that is disconnected from a traditional wide-area power grid.

BACKGROUND OF THE DISCLOSURE

A microgrid is a localized power grid that integrates renewable and/or non-renewable energy sources, and optionally mechanical or chemical energy storage sources into an electrical installation that can operate either connected with a main wide-area power grid or in an off-grid mode disconnected from the main wide-area power grid. Microgrids are often used at large institutions, such as college campuses and military installations, to provide greater flexibility in the management of energy and to enhance power reliability and resilience.

Modern microgrids increasingly utilize inverter based renewable sources, such as photovoltaic cells, solar panels and wind turbines. In many cases a microgrid may be operated disconnected from a wide-area distribution grid, with a majority of the energy sources being inverter based. In such case, fuses commonly used to isolate a faulted phase may not perform their function when the current is too low to melt the fuse.

Known methods and devices for locating and isolating electrical faults in a microgrid are both complex and unproven. Currently there is not any simple, reliable and inexpensive methods or apparatuses available to locate and isolate electrical faults in a microgrid having inverter-based sources while the microgrid is operating off-line (i.e., disconnected from a main wide-area power grid) without interfering with the use of conventional fuses when the microgrid is connected to the main power grid.

SUMMARY OF THE DISCLOSURE

An apparatus and method for isolating an electrical fault in a microgrid disconnected from a main power grid without interfering with conventional fuses used for isolating faults while the microgrid is connected to the main power grid is described. The apparatus includes a plurality of fault isolating devices distributed throughout a microgrid, preferably at each of a plurality of branches in the microgrid located downstream of an inverter-based power resource. Each device includes a voltage meter for detecting voltage anomalies indicative of a fault (such as a short circuit), a timer for establishing a time window during which a switch is opened, a switch for isolating a branch of the microgrid from sources and loads upstream of the device, and a microcontroller for operatively controlling the switch in response to voltage readings from the voltage meter.

The method involves setting a unique time window for each of the fault isolating devices distributed in the microgrid, opening the switch of each fault isolating device for the duration of the associated time window when a voltage anomaly is detected, and either closing the switch if the voltage anomaly persists during the time interval, or leaving the switch open to isolate a fault downstream of the isolation device if the anomaly disappears during the time interval.

DETAILED DESCRIPTION

Figure 1:
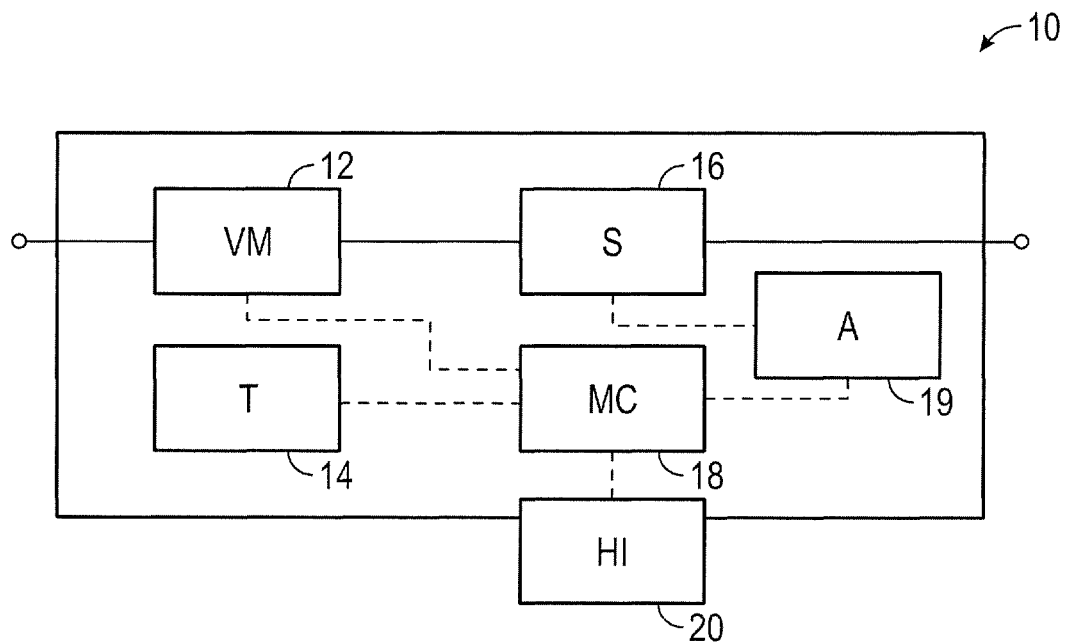
FIG. 1 is a schematic or functional representation of a fault isolating device in accordance with this disclosure for locating and isolating an electrical fault in a microgrid that is disconnected from a wide-area electrical grid.

Shown in FIG. 1 is a fault isolating device 10 in accordance with this disclosure. The device includes a voltage meter 12 for measuring phase-to-phase or phase-to-neutral voltage in a microgrid to detect a voltage anomaly that is characteristic of an electrical fault (e.g., a voltage drop that exceeds a predetermined threshold indicative of a short). The device also includes a timer 14 for establishing a time window, a switch 16 configured to isolate a portion of the microgrid from loads and power sources upstream of the device (i.e., nearer the feeder breaker connecting the microgrid to the main wide-area electric grid), and a microcontroller 18 (or microprocessor) for receiving voltage data from the voltage meter and determining whether a fault is present downstream of the fault isolating device. An actuator 19, such as a relay, can be used to set the state of switch 16 (i.e., open or closed).

Device 10 can be provided with a human interface component 20 for setting the beginning time (measured from the detection of a fault) of the time window and the ending time of the time window. Component 20 can be a knob, dial, series of switches (e.g., dip switches), or other component that allows the time window to be set. In a preferred embodiment, component 20 can be set to a particular integer value or setting (e.g., 1 to 99), wherein each integer value corresponds with a unique time window. For example, the first time window (integer setting 1) can begin at 1 second after a fault is detected and have a duration of perhaps 15 milliseconds, the second time window can have a start time of 1.015 seconds and end time of 1.030 seconds (again measured from the time a fault is detected), with each successive time window for an associated device 10 being shifted by 15 milliseconds. In this example, the 1 second delay before the first time window allows fuses to isolate the fault when higher electrical currents are present in the microgrid (e.g., when the microgrid is connected with the main wide-area power grid). At lower currents, such as when the microgrid is disconnected from the main wide-area power grid, fuses become inoperable and isolation of the fault is achieved using a plurality of devices 10 distributed throughout the microgrid.

Human interface component 20 could also include a second knob, dial or series of switches for adjusting the beginning time of all windows to provide a suitable waiting period (delay). This would allow multiple tiers of downstream coordination (e.g., by assigning ranges of integers, such as 1-99 downstream of another range, such as 100-199). Human interface component 20 could also be provided with a third knob, dial or series of switches to allow the duration of the interval window to be adjustably selected based on inverter response to be modeled and tested.

Figure 2:
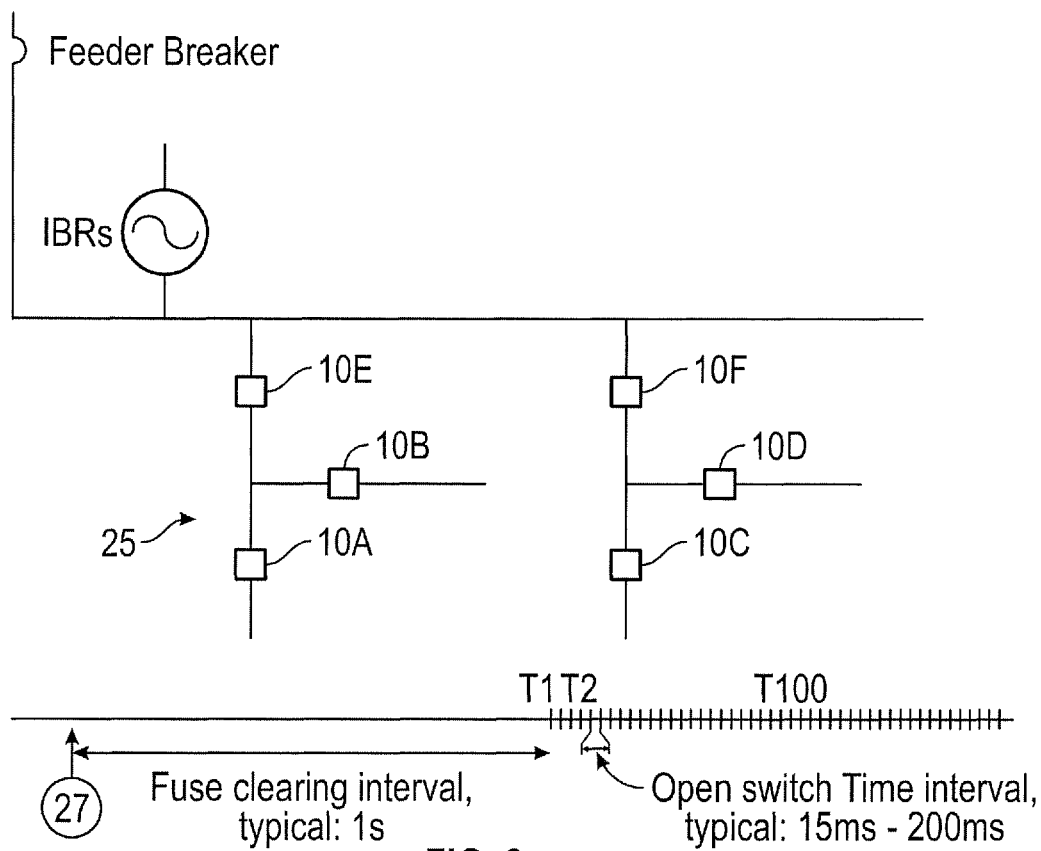
FIG. 2 is a schematic representation of a microgrid incorporating a plurality of fault isolating devices.

As shown in FIG. 2, devices 10 (shown in 10A through 10F) can be located at individual branches of a microgrid 25. When a fault occurs in an inverter-based resource (e.g., solar panels, wind turbines, etc., abbreviated as "IBR") microgrid that is islanded (disconnected from the main power grid), the fault current is comparable to the load current, and therefore conventional fuses will be inoperable. In such case, devices 10A-10F will wait until the normal fuse clearing time window has expired (e.g., for about 1 second after the fault is detected). Thereafter, a switch 16 in each device 10 will be opened during the associated time window for that device. The devices 10 are synchronized to within a few microseconds (e.g., within less than 15 microseconds for a microgrid with a footprint smaller than 4 km in its largest dimension) because all of the devices will see the same voltage drop within such time. If the fault is downstream of the device having the open switch, the voltage will return to normal (e.g., within threshold limits) and microcontroller 18 will leave the switch open. Otherwise, the switch is closed and the same process is repeated for each device 10A-10F. In order to minimize that portion of the microgrid that is isolated, those devices furthest downstream from the IBRs are preferably set to have the earliest time windows. For example, in the illustrated embodiment, the time windows for devices 10A and 10B (which are different and not overlapping) are preferably earlier than the time window for devices 10E, and the time windows for devices 10C and 10D are preferably earlier than the time window for device 10F.

Devices 10 can be located at each of a plurality of branches in a microgrid 25, and preferably in every one of the different branches of the microgrid. The voltage meter of each device measures phase-to-phase or phase-to-neutral voltage to detect an anomalous voltage and to detect whether the anomalous voltage disappears during the time window associated with the particular device 10 while switch 16 is open. When an anomaly indicative of an electrical fault occurs it is detected by each device 10 (devices 10A through 10F in the illustrated example). After a suitable waiting period (e.g., 0.1 seconds to 10 seconds, 0.5 seconds to 2 seconds, or about 0.75 seconds to 1.25 seconds), each of the devices opens its switch 16 during the associated time window, while the switches 16 of all other devices 10 remains closed. The switch 16 remains open for a time period that is sufficient to determine whether opening the switch causes the voltage anomaly to disappear. In such case, the switch remains open to isolate the fault. Otherwise, the switch is closed. This process continues for each of the devices 10 until the branch or branches of the microgrid having an electrical fault are isolated. A suitable time window during which switch 16 is open can range from 15 millisecond to 200 milliseconds, 15 milliseconds to 50 milliseconds, or 15 milliseconds to 20 milliseconds.

A time gap can be provided between successive time windows during which all switches are closed. This can be done, for example, by configuring devices 10 so that there is a time gap (e.g., 10 milliseconds) between successive time windows associated with the integer value or setting selectable via human interface component 20. Alternatively, devices 10 can be configured so that there is not any time gap between successive time windows associated with successive integers, with the desired time gap still achievable by selecting integer settings that are not successive (e.g., 1, 3, 5, etc.).

Figure 3A:
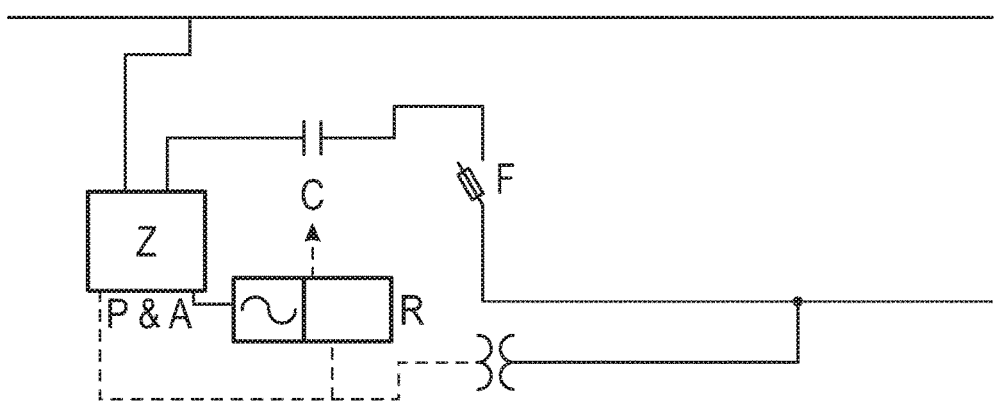
FIGS. 3A-3C show a logic diagram that describes the control logic for the method and apparatus.
Figure 3B:
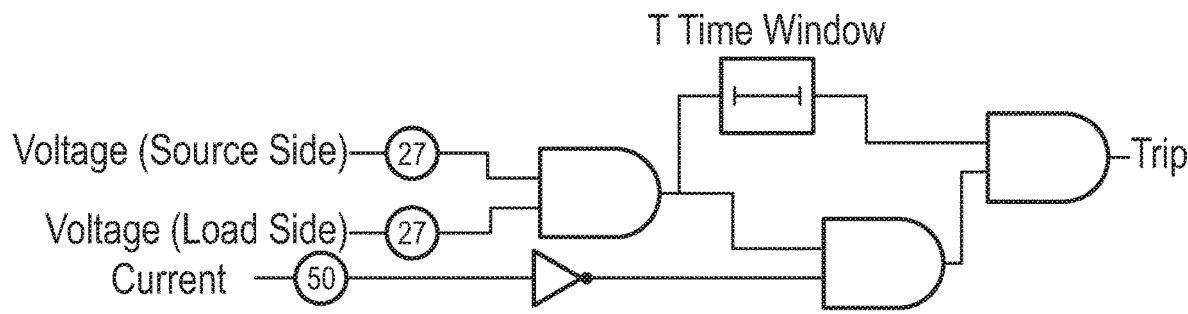
Figure 3C:
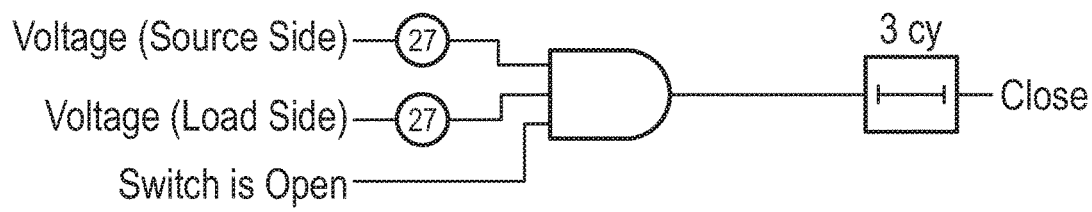

A control logic diagram for the devices 10 is shown in FIGS. 3A-3C. Contract (F) has low interrupting capability (e.g., 5 to 50 A). Relay (R) includes elements 27 supervised with element 50 and the time window. Inverter (Z) and capacitor (C) provide current, voltage and power supply.

The above description is intended to be illustrative, not restrictive. The scope of the invention should be determined with reference to the appended claims along with the full scope of equivalents. It is anticipated and intended that future developments will occur in the art, and that the disclosed devices, kits and methods will be incorporated into such future embodiments. Thus, the invention is capable of modification and variation and is limited only by the following claims.

What is claimed is:

1. A method for locating and isolating an electrical fault in a microgrid disconnected from a wide-area electrical grid, comprising:
   providing a fault isolating device at each of a plurality of branches in the microgrid, each isolating device including a voltage meter for measuring voltage to detect an anomaly, a timer for establishing a unique time window for each fault isolating device, a switch for isolating a branch of the microgrid from power loads and power sources upstream of the fault isolating device, and a microcontroller for opening the switch during the unique time window and leaving the switch open when a measured voltage anomaly disappears;
   setting the unique time windows of each fault isolating device so that the time windows are non-overlapping; and
   opening the switch of each fault isolating device for a duration of the associated unique time window when a voltage anomaly is detected and either closing the switch when the voltage anomaly persists during the unique time interval or leaving the switch open to isolate a fault downstream of the fault isolating device when if the anomaly disappears during the unique time window.

2. The method of claim 1, wherein there is a time delay before the non-overlapping time windows, the time delay being of sufficient duration to allow conventional fault isolation equipment to operate when the microgrid is connected with the wide-area electrical grid.

3. The method of claim 2, wherein the time delay is from 0.1 seconds to 10 seconds.

4. The method of claim 1, wherein the time windows are sequenced to open switches that are downstream of switches that have not already been opened.

5. The method of claim 1, wherein the time windows of each fault isolating device include time periods between successive windows during which all switches are closed.

6. The method of claim 1, wherein the duration of each time window is from 15 milliseconds to 200 milliseconds.

7. A fault isolating device comprising:
   a voltage meter configured for measuring phase-to-phase or phase-to-neutral voltage in a microgrid to detect a voltage anomaly characteristic of an electrical fault;
   a timer for establishing a time window;
   a switch configured to isolate a branch of the microgrid from power loads and power sources upstream of the fault isolating device; and
   a microcontroller configured to open the switch during the duration of the time window after the voltage anomaly is detected and leave the switch open when the voltage anomaly disappears during the time window, and close the switch when the voltage anomaly persists during the time window.

8. The fault isolating device of claim 7, further comprising a human interface component for setting the time window.

9. The fault isolating device of claim 8, wherein the human interface component is a knob, dial, or switch(es).

10. The fault isolating device of claim 7, further comprising an actuator for setting a state of the switch.

11. The fault isolating device of claim 10, wherein the actuator is a relay.

12. The fault isolating device of claim 8, wherein the human interface component allows selection of an integer setting associated with the time window.

13. The fault isolating device of claim 8, wherein the human interface device allows selection of one of a plurality of integer settings, each integer setting corresponding to a time window that does not overlap any other time windows corresponding with a different integer setting.

14. The fault isolating device of claim 8, wherein the human interface device further allows selection of a time duration for the time window.

15. A microgrid having a plurality of fault isolating devices each fault isolating device comprising a voltage meter configured for measuring phase-to-phase or phase-to-neutral voltage in a microgrid to detect a voltage anomaly characteristic of an electrical fault a timer for establishing a time window; a switch configured to isolate a branch of the microgrid from power loads and power sources upstream of the fault isolating device; and a microcontroller configured to open the switch during the duration of the time window after the voltage anomaly is detected and leave the switch open when the voltage anomaly disappears during the time window, and close the switch when the voltage anomaly persists during the time window, further comprising a human interface component for setting the time window.

16. The microgrid of claim 15, wherein the human interface component includes a knob, dial, or switch(es) for setting a time delay before a non-overlapping time windows.

17. The microgrid of claim 15, wherein each fault isolating device is synchronized to within 15 microseconds.

18. The microgrid of claim 16, wherein the human interface component allows selection of an integer setting associated with the time window; and wherein a first set of fault isolating devices has a first time delay and a second set of fault isolating devices has a second time delay, the first set of fault isolating devices being downstream of the second set of fault isolating devices, wherein the second time delay is greater than the first time delay.

* * * * *